US010908648B2

(12) United States Patent
Choi et al.

(10) Patent No.: US 10,908,648 B2
(45) Date of Patent: Feb. 2, 2021

(54) FOLDABLE DISPLAY APPARATUS AND METHOD OF MANUFACTURING THE SAME

(71) Applicant: Samsung Display Co., Ltd., Yongin-Si (KR)

(72) Inventors: Jaihyuk Choi, Yongin-si (KR); Sukwon Jung, Yongin-si (KR); Myungsoo Huh, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/882,391

(22) Filed: May 22, 2020

(65) Prior Publication Data

US 2020/0285282 A1    Sep. 10, 2020

Related U.S. Application Data

(63) Continuation of application No. 15/869,481, filed on Jan. 12, 2018, now Pat. No. 10,664,015.

(30) Foreign Application Priority Data

Sep. 27, 2017   (KR) .................... 10-2017-0125406

(51) Int. Cl.
*G06F 1/16*     (2006.01)
*H05K 1/02*     (2006.01)
*H05K 3/00*     (2006.01)
*H05K 1/03*     (2006.01)
*H04M 1/02*     (2006.01)
(Continued)

(52) U.S. Cl.
CPC ........ *G06F 1/1652* (2013.01); *H04M 1/0268* (2013.01); *H05K 1/0278* (2013.01); *H05K 1/0366* (2013.01); *H05K 3/0044* (2013.01);
*H01L 51/0097* (2013.01); *H01L 51/5253* (2013.01); *H04M 1/0214* (2013.01)

(58) Field of Classification Search
CPC ............... G06F 1/1652; H01L 51/0097; H01L 51/5253; H05K 1/0278; H05K 1/028; H05K 1/0281; H05K 1/0366
See application file for complete search history.

(56) References Cited

U.S. PATENT DOCUMENTS

| 6,927,344 B1 | 8/2005 | Gall et al. |
| 2005/0110049 A1 | 5/2005 | Urushido |
| 2008/0055831 A1 | 3/2008 | Satoh |

(Continued)

FOREIGN PATENT DOCUMENTS

| KR | 10-2006-0123597 A | 12/2006 |
| KR | 10-2014-0118676 A | 10/2014 |

(Continued)

OTHER PUBLICATIONS

Cordero, et al., "Channel Cracks in a Hermetic Coating Consisting of Organic and Inorganic Layers," Appl. Phys. Lett. 90, 111910 (2007), 4 pages.

(Continued)

*Primary Examiner* — Hoa C Nguyen
(74) *Attorney, Agent, or Firm* — Innovation Counsel LLP

(57) ABSTRACT

Disclosed is a foldable display apparatus in which a crack prevention layer is disposed on a surface of a display panel. The crack prevention layer includes thin film pattern portions disposed along a folding axis of the foldable display apparatus.

12 Claims, 7 Drawing Sheets

(51) Int. Cl.
*H01L 51/00* (2006.01)
*H01L 51/52* (2006.01)

(56) References Cited

U.S. PATENT DOCUMENTS

| | | |
|---|---|---|
| 2008/0179079 A1 | 7/2008 | Ishii et al. |
| 2013/0148312 A1* | 6/2013 | Han ................ H05K 1/028 |
| | | 361/736 |
| 2014/0299884 A1* | 10/2014 | Park ............... H01L 27/3276 |
| | | 257/72 |
| 2014/0306941 A1 | 10/2014 | Kim et al. |
| 2015/0195936 A1* | 7/2015 | Park ............... H01L 27/3211 |
| | | 361/749 |
| 2015/0207102 A1 | 7/2015 | Jeong et al. |
| 2015/0380679 A1 | 12/2015 | Fujiyoshi et al. |
| 2016/0118616 A1 | 4/2016 | Hirok et al. |
| 2016/0282993 A1* | 9/2016 | Song ................ G06F 3/044 |
| 2017/0155084 A1 | 6/2017 | Park et al. |
| 2017/0170206 A1* | 6/2017 | Lee ................ H01L 51/52 |
| 2017/0278900 A1* | 9/2017 | Yang ............... H01L 51/0097 |
| 2017/0294621 A1* | 10/2017 | Higano ............. G02F 1/13452 |
| 2018/0019440 A1 | 1/2018 | Namkung |

FOREIGN PATENT DOCUMENTS

| | | |
|---|---|---|
| KR | 10-2014-0122960 A | 10/2014 |
| KR | 10-2017-0064633 A | 6/2017 |

OTHER PUBLICATIONS

Bao, et al., "Remarks on Crack-Bridging Concepts," Appl. Mech. Rev. vol. 45, No. 8 (1992), 12 pages.

* cited by examiner

# FOLDABLE DISPLAY APPARATUS AND METHOD OF MANUFACTURING THE SAME

CROSS-REFERENCE TO RELATED APPLICATIONS

This application is a continuation application of U.S. patent application Ser. No. 15/869,481, filed on Jan. 12, 2018, which claims priority to Korean Patent Application No. 10-2017-0125406, filed on Sep. 27, 2017, in the Korean Intellectual Property Office, the disclosure of which is incorporated herein by reference in its entirety.

BACKGROUND

1. Field

One or more embodiments relate to a foldable display apparatus capable of being folded, and a method of manufacturing the same.

2. Description of the Related Art

Various types of display apparatuses such as flexible display apparatuses, rollable display apparatuses, and foldable display apparatuses have been developed. For example, a display apparatus such as an organic light-emitting display apparatus may have a foldable structure to be folded for convenience of portability.

However, when a foldable display apparatus keeps being folded and unfolded, stress is repeatedly applied around a folding axis, and cracks may appear. When the cracks gradually propagate, the foldable display apparatus may be damaged, and thus, the foldable display apparatus may not properly operate.

SUMMARY

One or more embodiments include a foldable display apparatus that is improved to restrict the appearance and propagation of cracks, and a method of manufacturing the foldable display apparatus.

Additional aspects will be set forth in part in the description which follows and, in part, will be apparent from the description, or may be learned by practice of the presented embodiments.

According to one or more embodiments, a foldable display apparatus includes: a display panel that is foldable along a folding axis; and a crack prevention layer disposed on a surface of the display panel, wherein the crack prevention layer includes a plurality of thin film pattern portions disposed along the folding axis.

The plurality of thin film pattern portions may be disposed at a predetermined interval along the folding axis.

The plurality of thin film pattern portions may be spaced apart from one another.

The plurality of thin film pattern portions may be connected to form an integrated structure.

The foldable display apparatus may further include a plurality of auxiliary thin film pattern portions that is disposed at a second predetermined interval in a direction perpendicular to the plurality of thin film pattern portions.

The plurality of thin film pattern portions may include any one of an organic layer and an inorganic layer.

The plurality of thin film pattern portions may have a multi-layer structure in which an organic layer and an inorganic layer are stacked.

The crack prevention layer may be on an outer surface of the display panel.

The crack prevention layer may be on inner and outer sides of the display panel.

According to one or more embodiments, a method of manufacturing a foldable display apparatus includes: preparing a display panel that is foldable along a folding axis; and forming a crack prevention layer on a surface of the display panel, wherein the crack prevention layer includes a plurality of thin film pattern portions disposed along the folding axis.

The plurality of thin film pattern portions may be disposed at a predetermined interval along the folding axis.

The plurality of thin film pattern portions may be spaced apart from one another.

The plurality of thin film pattern portions may be connected to form an integrated structure.

The method may further include forming a plurality of auxiliary thin film pattern portions that is disposed at a second predetermined interval in a direction perpendicular to the plurality of thin film pattern portions.

The plurality of thin film pattern portions may include any one of an organic layer and an inorganic layer.

The plurality of thin film pattern portions may have a multi-layer structure in which an organic layer and an inorganic layer are stacked.

The crack prevention layer may be on an outer surface of the display panel.

The crack prevention layer may be on inner and outer sides of the display panel.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
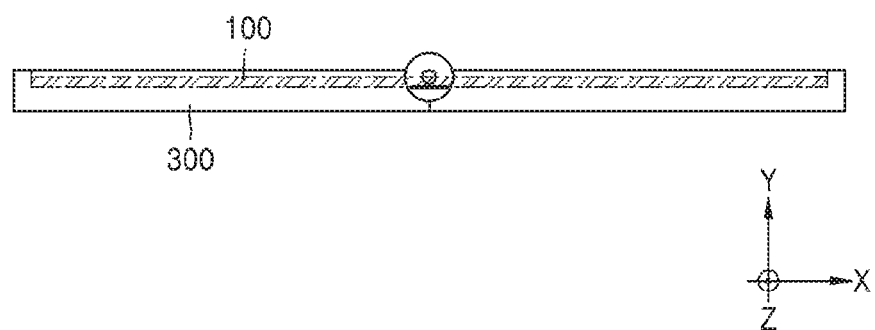
FIG. 1 is a front view illustrating an unfolded state of a foldable display apparatus, according to an embodiment.

As the present disclosure allows for various changes and numerous embodiments, particular embodiments will be illustrated in the drawings and described in detail in the written description. The attached drawings for illustrating embodiments of the present disclosure are referred to gain a sufficient understanding of the present disclosure, the merits thereof, and the objectives accomplished by the implementation of the present disclosure. The present disclosure may, however, be embodied in many different forms and should not be construed as being limited to the embodiments set forth herein.

The present disclosure will now be described more fully with reference to the accompanying drawings, in which exemplary embodiments of the disclosure are shown. Like reference numerals in the drawings denote like elements, and thus their description will be omitted.

As used herein, the singular forms "a", "an," and "the" are intended to include plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from an order described herein. For example, two consecutively described processes may be performed substantially at the same time or performed in an order opposite to the described order.

Figure 2:
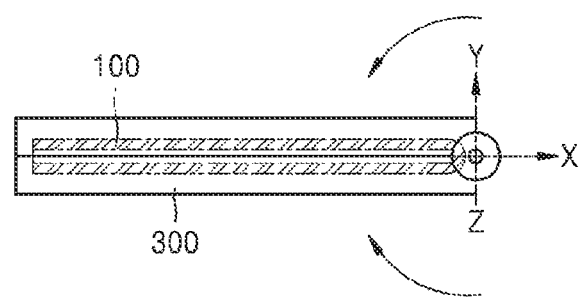
FIG. 2 is a front view illustrating a folded state of the foldable display apparatus of FIG. 1.

FIGS. 1 and 2 respectively illustrate an unfolded state and a folded state of a foldable display apparatus, according to an embodiment.

The foldable display apparatus includes a display panel 100 that may be flexibly bent. The display panel 100 may generally include a structure (refer to FIG. 7B) in which a thin film transistor and an emission element for producing an image, an encapsulation layer for covering and protecting the thin film transistor and the emission element, and the like are stacked on a flexible substrate. Since the flexible substrate is used instead of a rigid glass substrate, the display panel 100 may be folded and unfolded within a range of flexibility thereof. The display panel 100 may remain folded in the folded state, as illustrated in FIG. 2.

As illustrated in FIGS. 1 and 2, the display panel 100 may be supported by a case 300, and as the case 300 rotates, the display panel 100 may be folded or unfolded.

Compressive stress and tensile stress may be applied around a folding axis of the display panel 100 that is repeatedly bent and unbent whenever the display panel 100 is folded and unfolded. That is, in the folded state of FIG. 2, compressive stress is applied to an inner surface of the display panel 100 around the folding axis, and tensile stress is applied to an outer surface of the display panel 100. Herein, the outer surface of the display panel 100 corresponds to a surface of the display panel 100 that forms an outer side when the display panel 100 is in the folded stated, whereas the inner surface of the display panel 100 faces each other when the display panel 100 is in the folded position in the cross-sectional view shown in FIG. 2. Referring to FIGS. 1 and 2, the outer surface corresponds to a bottom surface of the display panel 100, and the inner surface corresponds to an upper surface of the display panel 100. When stress keeps being applied in different directions, cracks may particularly appear in a portion of the display panel 100 where tensile stress is applied, and thus the cracks may propagate.

Figure 3A:
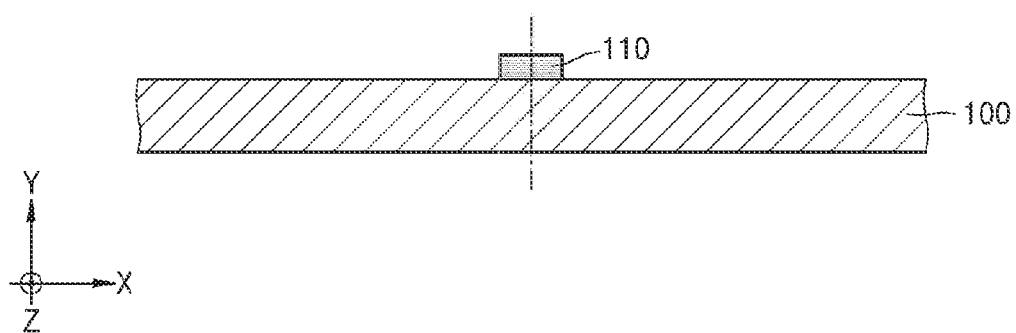
FIG. 3A is a cross-sectional view illustrating an unfolded state of a display panel of the foldable display apparatus of FIG. 1.
Figure 3B:
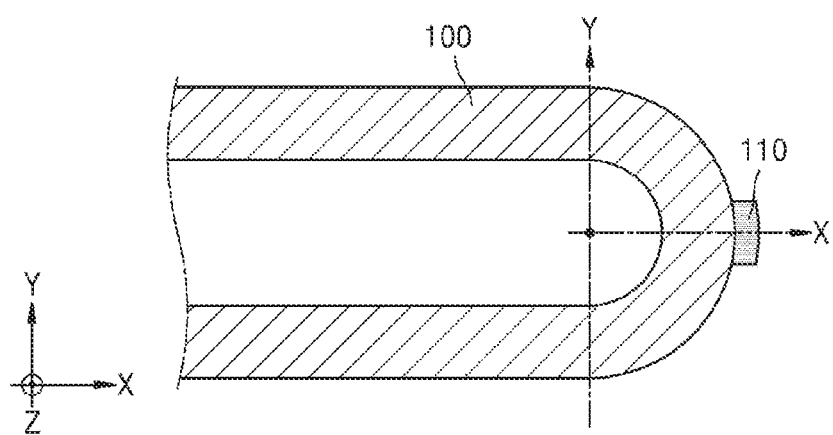
FIG. 3B is a cross-sectional view illustrating a folded state of the display panel of FIG. 3A.
Figure 3C:
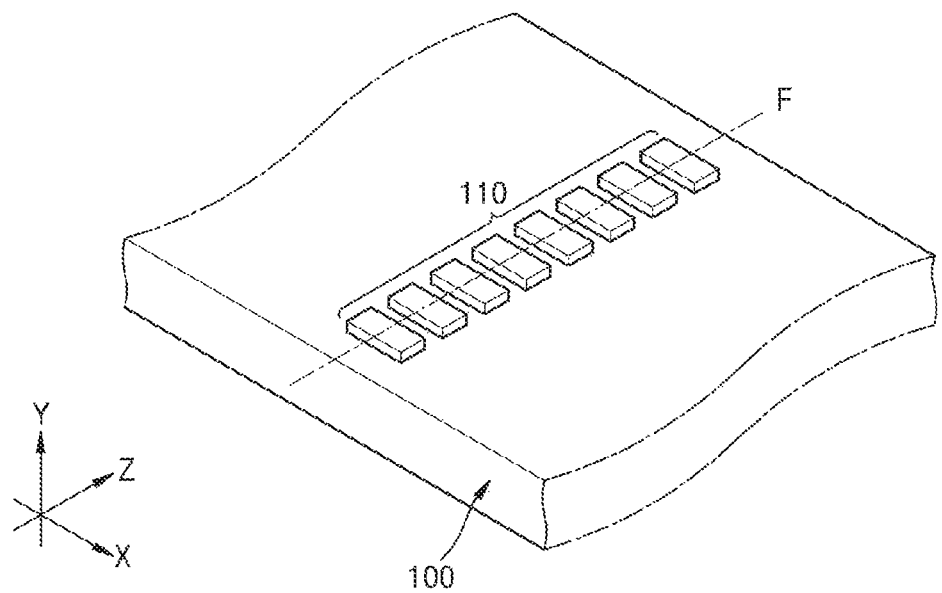
FIG. 3C is a perspective view of the display panel of FIG. 3A.

In order to prevent cracks, in the present embodiment, a crack prevention layer 110 is formed on a folding axis F of the display panel 100, as illustrated in FIGS. 3A to 3C. As illustrated in FIG. 3C, the crack prevention layer 110 is formed by arranging multiple thin film pattern portions that extend in a direction crossing the folding axis F, along the folding axis F at a predetermined interval. Although a folding operation and an unfolding operation are repeated, cracks may not easily appear in the folding axis F due to the crack prevention layer 110, Even if cracks appear, the crack prevention layer 110 that includes thin film patter portions arranged at a predetermined interval can prevent propagation of the cracks along the folding axis F through the display panel 100 as well as the crack prevention layer 110. The crack prevention layer 100 increases the resistance to the appearance and propagation of the cracks.

Figure 3D:
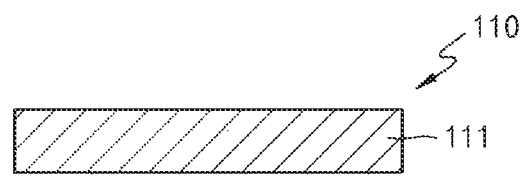
FIGS. 3D to 3F are cross-sectional views of examples of thin film pattern portions forming a crack prevention layer of the display panel of FIG. 3A.
Figure 3E:
Figure 3F:
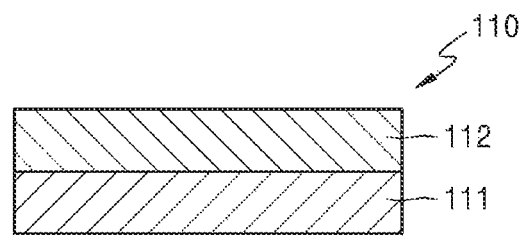

The thin film pattern portion of the crack prevention layer 110 may be a single organic layer 111, as illustrated in FIG. 3D, a single inorganic layer 112, as illustrated in FIG. 3E, or a multilayer in which the organic layer 111 and the inorganic layer 112 are stacked, as illustrated in FIG. 3F. The organic layer 111 may relieve stress by absorbing fracture energy generated during the propagation of the cracks, and the inorganic layer 112 may function as a barrier that prevents the propagation of the cracks. Thus, when the crack prevention layer 110 is formed by properly combining the organic layer 111 with the inorganic layer 112, the appearance and propagation of the cracks may be effectively prevented. In addition, since the entire folding axis is not covered by the crack prevention layer 110, but the crack prevention layer 110 include thin film portions arranged at a predetermined interval, the display panel 100 may be smoothly folded despite an increase in a thickness of a peripheral area along the folding axis F due to the crack prevention layer 110. That is, although the crack prevention layer 110 is additionally formed, a folding operation is not disturbed. When the thickness of the crack prevention layer 110 excessively increases, the folding operation may be disturbed. Thus, it is advantageous to form the thin film pattern portions to have a thickness of less than 5000 Å.

When the display panel 100 having the above structure is folded as illustrated in FIG. 3B, the greatest tensile stress is applied to an outer peripheral layer of the folding axis F, and thus the possibility that the cracks appear may increase. However, when the crack prevention layer 110 is formed on the folding axis F, the appearance and propagation of the cracks may be restricted.

A method of manufacturing a foldable display apparatus having the above structure will be described below, and an internal structure of the display panel 100 will be briefly described first.

Figure 7A:
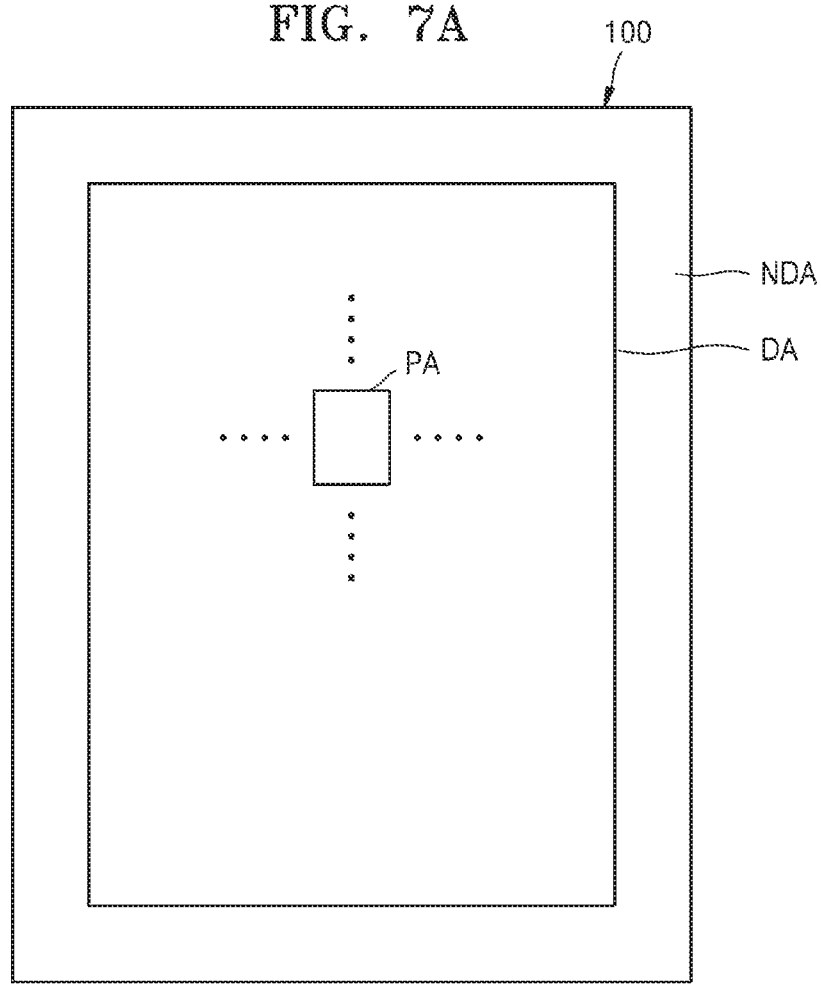
FIG. 7A is a plan view of the display panel of FIG. 3A.

FIG. 7A schematically illustrates a planar structure of the display panel 100. The display panel 100 includes a display area DA where an image is displayed, and a non-display area NDA adjacent to the display area DA. The display area DA includes multiple pixel areas PA, and a pixel that emits certain light is formed in each pixel area PA. As the pixels emit light in the display area DA, images are produced in the display area DA.

The non-display area NDA may surround the display area DA and may include driving units such as a scan driving unit (not illustrated) and a data driving unit (not illustrated) for transmitting signals to the pixels in the display area DA.

FIG. 7A illustrates that the non-display area NDA surrounds the display area DA, but one or more embodiments of the present disclosure are not limited thereto. In another embodiment, the non-display area NDA may be on one side of the display area DA and may decrease an area, that is, a dead area, where an image is not displayed.

Figure 7B:
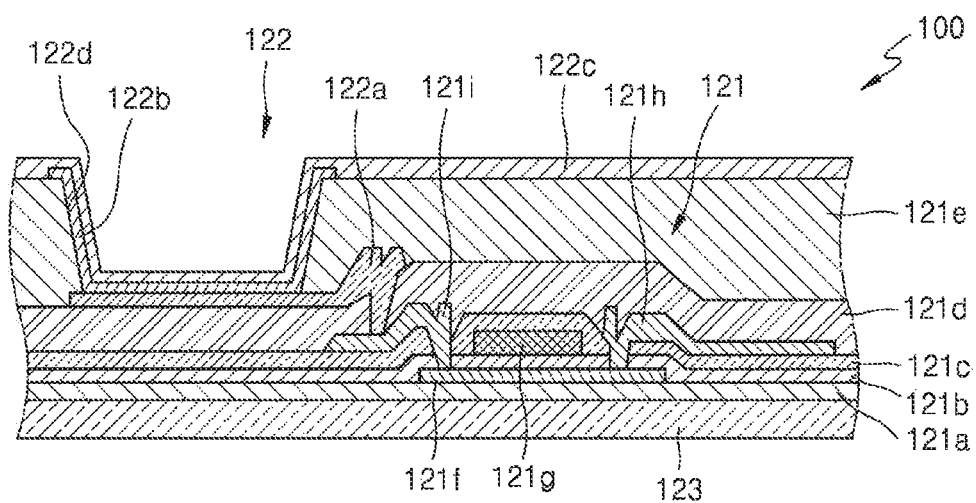
FIG. 7B is a cross-sectional view illustrating a detailed structure of a display area of the display panel of FIG. 7A.

As illustrated in FIG. 7B, a thin film transistor 121 and an organic emission element 122 are included in one pixel area PA of the display area DA. In a structure of the thin film transistor 121, an active layer 121f is disposed on a buffer layer 121a that is disposed on a flexible substrate 123 and has source and drain areas that are doped with N-type or P-type impurities at high concentrations. The active layer 121f may include an oxide semiconductor. For example, the oxide semiconductor may include an oxide selected from the group consisting of Groups 12, 13, and 14 metal elements such as zinc (Zn), indium (In), gallium (Ga), tin (Sn), cadmium (Cd), germanium (Ge), and hafnium (Hf), and a combination thereof. For example, the active layer 121f may include G-I-Z-O[(In$_2$O$_3$)a(Ga$_2$O$_3$)b(ZnO)c] (where, a, b, and c are real numbers satisfying a≥0, b≥0, and c>0, respectively). A gate electrode 121g is disposed above the active layer 121f with a gate insulating layer 121b therebetween, and a source electrode 121h and a drain electrode 121i are disposed on the gate electrode 121g. An interlayer insulating layer 121c is disposed between the gate electrode 121g and the source and drain electrodes 121h and 121i, and a passivation layer 121d is disposed between the source and drain electrodes 121h and 121i and an anode electrode 122a of the organic emission element 122.

An insulating planarization layer 121e including acryl, etc. is disposed on the anode electrode 122a. After an opening 122d is formed in the insulating planarization layer 121e, the organic emission element 122 is formed.

The organic emission element 122 displays image information by emitting red light, green light, or blue light according to a current flow, and is connected to the drain electrode 121i of the thin film transistor 121. The organic emission element 122 includes the anode electrode 122a connected to the drain electrode 121i that supplies positive power to the anode electrode 122a; a cathode electrode 122c covering the total pixels and supplies negative power; and an emission layer 122b that is disposed between the anode electrode 122a and the cathode electrode 122 and emits light.

Adjacent to the emission layer 122b, a Hole Injection Layer (HIL), a Hole Transport Layer (HTL), an Electron Transport Layer (ETL), an Electron Injection Layer (EIL), etc. may be stacked.

The emission layer 122b may be formed in each pixel in such a manner that pixels respectively emitting red, green, and blue light collectively form one unit pixel. Alternatively, regardless of locations of the pixels, an emission layer may be commonly formed over the entire pixel area. In this case, the emission layer may be formed as layers including emission materials emitting, e.g., red, green, and blue light, are vertically stacked or combined with each other. If an emission layer emits white light, other combinations of colors may be made. Also, the emission layer may further include a color conversion layer or a color filter for converting the emitted white light into another color.

A thin film encapsulation layer (not illustrated), in which an organic layer and an inorganic layer are alternately stacked, may be formed on the cathode electrode 122c.

Since the display panel 100 having the above structure may have a flexible structure, the display panel 100 may be bent or unbent according to the folding operation or unfolding operation as described above.

The foldable display apparatus having the above structure may be manufactured as follows.

The display panel 100 that is foldable may be prepared.

As illustrated in FIG. 3C, the crack prevention layer 110 may be formed along the folding axis F of the display panel 100. In this case, a deposition method using a mask may be used, and the thin film pattern portions may be patterned as the single organic layer 111 of FIG. 3D, the single inorganic layer 112 of FIG. 3E, or the multilayer in which the organic layer 111 and the inorganic layer 112 are stacked as illustrated in FIG. 3F. Regardless of structure of the crack prevision layer 110, the total thickness of the crack prevention layer 110 is kept to be less than 5000 Å.

The display panel 100, in which the crack prevention layer 110 is formed on the folding axis F, may be combined with the case 300 of FIG. 1.

When the foldable display apparatus is stored or transported, the foldable display apparatus remains folded as illustrated in FIGS. 2 and 3B, and accordingly stress is applied to the peripheral area of the folding axis F of the display panel 100. However, since the crack prevention layer 110 including the thin film pattern portions is formed on the folding axis F, cracks may not easily appear even though the display panel 100 is repeatedly folded or remains in a folded position over an extended period of time. Although cracks may appear, the cracks may not easily propagate due to the crack prevention layer 110, and thus a damage to the foldable display apparatus may be restricted.

When an image is viewed while the display apparatus is unfolded, the display panel 100 is in the unfolded state by straightly unfolding the same as illustrated in FIGS. 1 and 3A. Therefore, a user may view a planar image on the display panel 100 that is straightly unfolded, and the peripheral portion of the folding axis F is stably supported by the crack prevention layer 110, and thus, the appearance and propagation of the cracks may be restricted.

Figure 4:
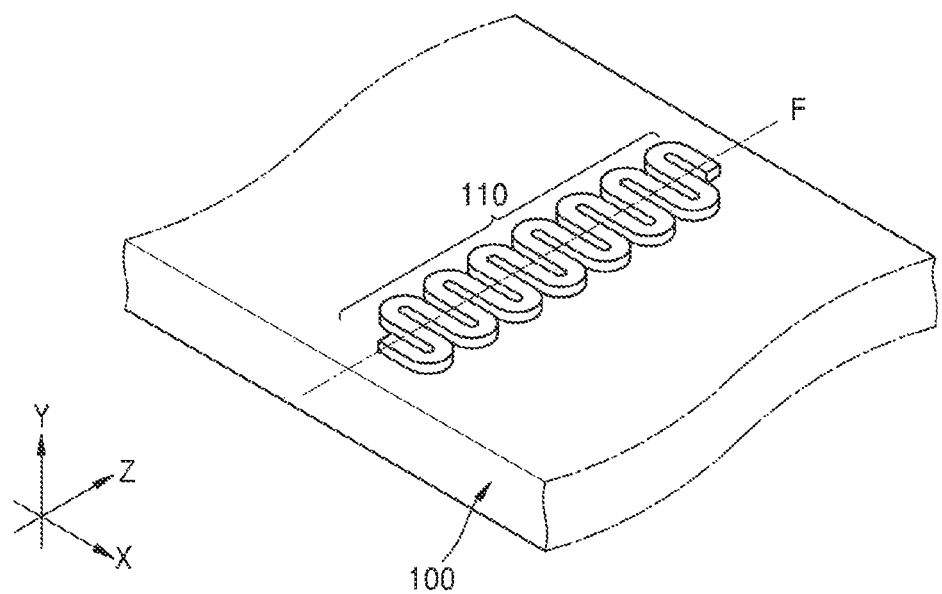
FIGS. 4 to 6 are cross-sectional views of a modifiable example of a crack prevention layer of FIG. 3A.

In the present embodiment, the thin film pattern portions forming the crack prevention layer 110 are spaced apart from one another, but as illustrated in FIG. 4, end portions of the thin film pattern portions may be connected in a zigzag manner and thus form an integrated structure. That is, the structure of the crack prevention layer 110 including the thin film pattern portions that cross the folding axis F may be basic, but the structure thereof may vary. For example, the end portions of the thin film pattern portions may be connected to or separated from one another.

Figure 5:
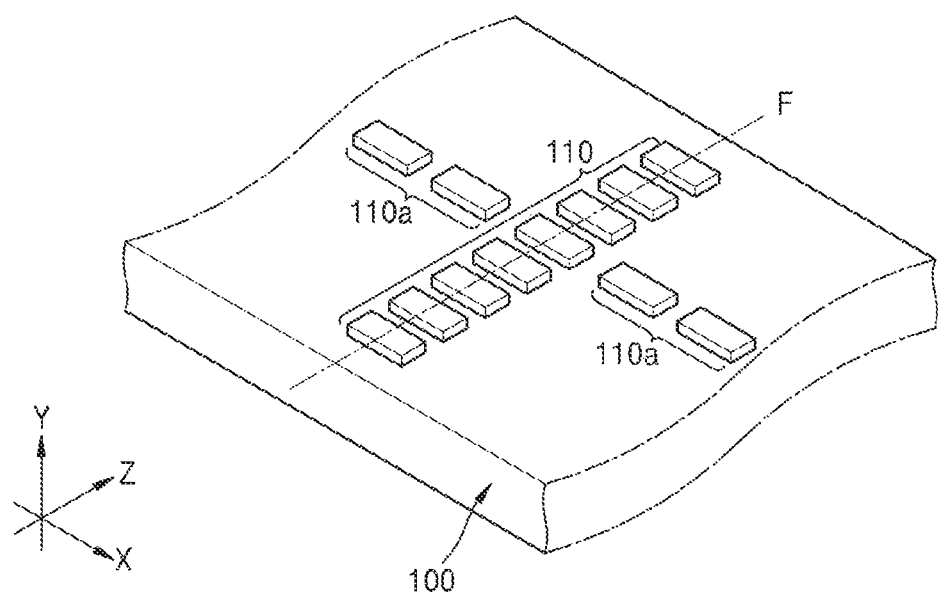

Also, as illustrated in FIG. 5, other than the thin film pattern portions arranged at a predetermined interval along the folding axis F, the crack prevention layer 110 may further include auxiliary thin film pattern portions 110a that are arranged at a second predetermined interval in a direction perpendicular to the thin film pattern portions. That is, while the folding operation is repeatedly performed, stress may also be applied to the display panel 100 in a stretching direction (an X direction) by as much as stress applied to the folding axis F. When the auxiliary thin film pattern portions 110a are formed, the auxiliary thin film pattern portions 110a may prevent cracks from appearing and propagating in the stretching direction.

Figure 6:
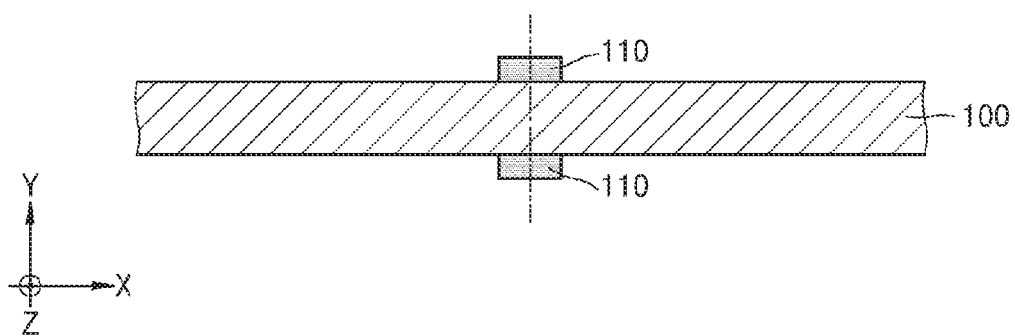

Cracks may mostly appear in a portion where tensile stress is applied, and thus, according to the embodiments, the crack prevention layer 110 is formed on an outer peripheral surface of the display panel 100 along the folding axis F. As illustrated in FIG. 6, the crack prevention layer 110 may also be formed on an inner surface of the display panel 100 where compressive stress is applied. That is, the crack prevention layer 110 is formed on both sides of the display panel 100 to increase the resistance to cracks.

As described above, a foldable display apparatus may effectively prevent cracks from appearing and propagating around a folding axis even though a folding operation and an unfolding operation are repeatedly performed, and thus quality of a product may be stabilized.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A flexible display apparatus comprising:
   a display panel that is bendable along a bending axis, wherein the display panel includes a display area and a non-display area, and the display area includes a first display region, a second display region, and a bending region disposed between the first display region and the second display region; and
   a crack prevention layer disposed on an outer surface of the display panel at least in the bending region of the display area,
   wherein the crack prevention layer comprises a plurality of first portions and a plurality of second portions,
   wherein the plurality of first portions is disposed to be spaced apart from one another at a predetermined interval along the bending axis,
   wherein each of the plurality of second portions is disposed between adjacent ones of the plurality of first portions along a first direction intersecting the bending axis, and
   wherein, when the flexible display apparatus is in a bent state, the plurality of first portions of the crack prevention layer faces outwardly away from the bending axis, and at least one of both surfaces of the first display region and at least one of both surfaces of the second display region face each other along the first direction.

2. The flexible display apparatus of claim 1, wherein the plurality of the first portions and the plurality of second portions are connected to each other to form an integrated structure.

3. The flexible display apparatus of claim 1, wherein the plurality of first portions and the plurality of second portions comprise any one of an organic layer and an inorganic layer.

4. The flexible display apparatus of claim 1, wherein the plurality of first portions and the plurality of second portions have a multi-layer structure in which an organic layer and an inorganic layer are stacked.

5. The flexible display apparatus of claim 1, wherein the crack prevention layer is disposed on a flexible substrate or a thin film encapsulation layer.

6. The flexible display apparatus of claim 1, wherein the crack prevention layer is disposed on both a flexible substrate and a thin film encapsulation layer.

7. A flexible display apparatus comprising:
   a flexible substrate;
   a first display region on the flexible substrate, the first display region comprising a first emission element;
   a second display region on the flexible substrate, the second display region comprising a second emission element and facing the first display region when the flexible display apparatus is in a bent state,
   a bending region on the flexible substrate, the bending region disposed between the first display region and the second display region, and the bending region comprising a third emission element;
   a thin film encapsulation layer disposed on the first emission element, the second emission element, and the third emission element; and
   a crack prevention layer disposed on an outer surface of the flexible substrate or the thin film encapsulation layer in the bending region, the crack prevention layer comprising a plurality of thin film pattern portions being spaced apart from one another,
   wherein, when the flexible display apparatus is in the bent state, the plurality of thin film pattern portions of the crack prevention layer faces outwardly away from a bending axis.

8. The flexible display apparatus of claim 7, wherein the plurality of thin film pattern portions is disposed at a first predetermined interval along the bending axis, the flexible display apparatus being bendable along the bending axis.

9. The flexible display apparatus of claim 7, further comprising a plurality of auxiliary thin film pattern portions that is disposed at a second predetermined interval in a direction perpendicular to the plurality of thin film pattern portions.

10. The flexible display apparatus of claim 7, wherein the plurality of thin film pattern portions comprise any one of an organic layer and an inorganic layer.

11. The flexible display apparatus of claim 7, wherein the plurality of thin film pattern portions have a multi-layer structure in which an organic layer and an inorganic layer are stacked.

12. The flexible display apparatus of claim 7, wherein the crack prevention layer is disposed on both the flexible substrate and the thin film encapsulation layer.

* * * * *